(12) United States Patent
Nakashima et al.

(10) Patent No.: US 7,731,797 B2
(45) Date of Patent: Jun. 8, 2010

(54) SUBSTRATE TREATING APPARATUS AND SEMICONDUCTOR DEVICE MANUFACTURING METHOD

(75) Inventors: Seiyo Nakashima, Toyama (JP); Tomoshi Taniyama, Toyama (JP); Kenichi Suzaki, Toyama (JP); Yoshikazu Takashima, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 468 days.

(21) Appl. No.: 11/665,217

(22) PCT Filed: Oct. 26, 2005

(86) PCT No.: PCT/JP2005/019670
§ 371 (c)(1),
(2), (4) Date: Oct. 2, 2007

(87) PCT Pub. No.: WO2006/049055
PCT Pub. Date: May 11, 2006

(65) Prior Publication Data
US 2008/0134977 A1 Jun. 12, 2008

(30) Foreign Application Priority Data
Nov. 1, 2004 (JP) .............................. 2004-318194

(51) Int. Cl.
*C23C 16/00* (2006.01)
*H01L 21/00* (2006.01)

(52) U.S. Cl. ...................... 118/715; 118/729; 438/758; 257/E21.001

(58) Field of Classification Search ................. 118/715, 118/719, 728, 729; 438/4, 758; 257/E21.001
See application file for complete search history.

(56) References Cited

U.S. PATENT DOCUMENTS 6,806,211 B2 * 10/2004 Shinriki et al. .............. 438/785

(Continued)

FOREIGN PATENT DOCUMENTS

JP   2-47828   2/1990

(Continued)

*Primary Examiner*—Tuan N. Quach
(74) *Attorney, Agent, or Firm*—Kratz, Quintos & Hanson, LLP

(57) ABSTRACT

A gas flow in a load-lock type preliminary chamber is improved. A load-lock type substrate treating apparatus contains a processing chamber (34) for storing and processing a substrate (1); a preliminary chamber (23) continuously arranged to the processing chamber (31); a substrate holding jig mechanism (40) for carrying in and carrying out a substrate holding jig (50) holding multiple substrates (1), to and from the processing chamber (31); an inert gas supply port (61) for supplying inert gas to the preliminary chamber (23); a first exhaust port (71) provided above the inert gas supply port (61) in the preliminary chamber (23) to exhaust the inert gas: a second exhaust port (81) to draw a vacuum in the preliminary chamber (23); and a controller (100) for performing control so that the inert gas supplied from the inert gas supply port (61) is exhausted only from the first exhaust port (71), while maintaining the preliminary chamber (23) drawn a vacuum from the second exhaust port (81) at a specified pressure after raising the pressure.

11 Claims, 8 Drawing Sheets

U.S. PATENT DOCUMENTS

| | | | |
|---|---|---|---|
| 7,256,370 B2 * | 8/2007 | Guiver | 219/390 |
| 7,408,225 B2 * | 8/2008 | Shinriki et al. | 257/359 |
| 7,559,992 B2 * | 7/2009 | Suzuki et al. | 118/719 |
| 2009/0220692 A1 * | 9/2009 | Takagi et al. | 427/255.7 |

FOREIGN PATENT DOCUMENTS

| | | |
|---|---|---|
| JP | 5-8936 | 2/1993 |
| JP | 6-224143 | 8/1994 |
| JP | 2000-58530 | 2/2000 |

* cited by examiner

SUBSTRATE TREATING APPARATUS AND SEMICONDUCTOR DEVICE MANUFACTURING METHOD

TECHNICAL FIELD

The present invention relates to a substrate treating apparatus and semiconductor device manufacturing method, and in particular is effective for use in film-forming processes for forming CVD films such as metallic films and oxide films on semiconductor wafers (hereafter called wafers) to make semiconductor integrated circuits devices (hereafter called ICS) in IC manufacturing methods

BACKGROUND ART

Batch type vertical hot wall depressurizing CVD apparatus are widely used in film-forming processes in IC manufacturing methods for depositing silicon nitride ($Si_3N_4$), silicon oxide (SiOx) or polysilicon on wafers.

This batch type vertical hot wall depressurizing CVD apparatus contains a process tube forming a processing chamber for forming film via a thermal CVD reaction on the wafer stored inside; a boat for loading/unloading multiple wafers held in arrayed state into/from a processing chamber; a standby chamber formed directly below the process tube for maintaining the boat for loading/unloading into/from the processing chamber in standby; and a boat elevator for raising and lowering the boat and carry them in or out of the processing chamber.

In the prior art, CVD apparatus of this type are load-lock batch type vertical hot wall depressurizing CVD apparatus (hereafter called load-lock CVD apparatus) including a standby chamber formed as a vacuum container (hereafter called, load-lock type chamber) capable of withstanding pressures below atmospheric pressure. See patent document 1 and patent document 2 for examples.

The load-lock method is a method that uses a valve such as a gate valve to isolate the processing chamber from preliminary chamber (standby chamber), prevents the inflow of air into the processing chamber, and stabilize the process by reducing external disturbances such as from temperature and pressure.

Patent document 1: Japanese Patent Non-examined Publication No. 2003-151909

Patent document 2: Japanese Patent Non-examined Publication No. 09-298137

DISCLOSURE OF INVENTION

Problems to be Solved by Invention

IN load-lock type CVD apparatus where the standby chamber is the preliminary chamber, generally little consideration was given to the placement of the vacuum exhaust port utilized when drawing a vacuum, and the purge gas supply port as well as the vent exhaust port utilized as an exhaust port for exhaust when the pressure is higher than atmospheric pressure. These load-lock type CVD apparatus therefore had the problem that a drop in production yield occurs since foreign contaminants emitted from the boat elevator enter the processing chamber or particles sunken at the bottom of the standby chamber float upwards.

The present invention has the object of providing a substrate treating apparatus and a semiconductor device manufacturing method capable of improving the flow of gas in load-lock type preliminary chambers.

Means to Solve the Problems

Typical aspects of the present invention to resolve the above mentioned problems are related as follows.

(1) A substrate treating apparatus comprising:
a processing chamber for storing and processing a substrate;
a preliminary chamber continuously arranged to the processing chamber;
a substrate holding jig mechanism for carrying in and/or carrying out a substrate holding jig for holding multiple substrates to and from the processing chamber;
an inert gas supply port for supplying inert gas to the preliminary chamber;
a first exhaust port provided in the preliminary chamber at a position higher than the inert gas supply port for exhausting the inert gas;
a second exhaust port for drawing a vacuum in the preliminary chamber; and
a controller for performing control so that the inert gas supplied from the inert gas supply port is exhausted only from the first exhaust port, while maintaining the preliminary chamber drawn a vacuum from the second exhaust port at a specified pressure after rising of the pressure.

(2) A substrate treating apparatus comprising:
a processing chamber for storing and processing a substrate;
a preliminary chamber continuously arranged to the processing chamber;
a substrate holding jig mechanism for carrying in and/or carrying out a substrate holding jig for holding multiple substrates to and from the processing chamber;
an inert gas supply port for supplying inert gas to the preliminary chamber, and provided in the preliminary chamber at a position lower than a substrate holding area for holding the substrates in the substrate holding jig; and
a first exhaust port for exhausting the inert gas and provided in the preliminary chamber at a position higher than the substrate holding area.

(3) The substrate treating apparatus according to the second aspect (2), comprising the preliminary chamber containing an exhaust port separate from the first exhaust port and lower than the top edge of the substrate holding area; and a controller for performing control when the substrate holding jig holding the substrates is carried into the processing chamber from the preliminary chamber and/or is carried out from the processing chamber into the preliminary chamber, so that inert gas supplied from the inert gas supply port flows from below the substrate holding area to higher than the substrate holding area, and is exhausted only from the first exhaust port higher than the substrate area among the multiple exhaust ports provided in the preliminary chamber.

(4) The substrate treating apparatus according to the second aspect (2), comprising a second exhaust port separate from the first exhaust port and provided in the preliminary chamber at a position lower than the substrate holding area; and a controller for regulating the pressure within the preliminary chamber during exhaust from the second exhaust port, to a pressure lower than the pressure within the preliminary chamber during exhaust from the first exhaust port.

(5) The substrate treating apparatus according to the first aspect (1), wherein the substrate holding jig mechanism comprises a drive unit and a substrate holding jig placement unit connecting to the drive unit; the preliminary chamber is partitioned by a partition plate into an area where the drive unit is installed, and an area where the substrate holding jig is installed in the substrate holding jig placement unit; the first exhaust port is provided to connect to the area where the drive unit is installed; and the inert gas supply port is provided to connect to the area where the substrate holding jig is installed.

(6) The substrate treating apparatus according to the second aspect (2), wherein the substrate holding jig mechanism comprises a drive unit and a substrate holding jig placement unit connecting to the drive unit; the preliminary chamber is partitioned by a partition plate into an area where the drive unit is installed, and an area where the substrate holding jig is installed in the substrate holding jig placement unit; the first exhaust port is provided to connect to the area where the drive unit is installed; and the inert gas supply port is provided to connect to the area where the substrate holding jig is installed.

(7) The substrate treating apparatus according to any one of aspects (1), (2), (3), (4), (5), or (6), wherein a porous material member is provided in the inert gas supply port, and the inert gas is supplied from the inert gas to the preliminary chamber.

(8) The substrate treating apparatus according to the first aspect (1), wherein the specified pressure is a pressure in the vicinity of atmospheric pressure.

(9) The substrate treating apparatus according to any one of aspects (5) or (6), wherein a gap is provided between the side wall of the preliminary chamber and the partition plate.

(10) A semiconductor device manufacturing method using a substrate treating apparatus comprising a processing chamber for storing and processing a substrate; a preliminary chamber continuously arranged to the processing chamber; a substrate holding jig mechanism for carrying in and/or carrying out a substrate holding jig for holding multiple substrates to and from the processing chamber; an inert gas supply port for supplying inert gas to the preliminary chamber; a first exhaust port provided in the preliminary chamber at a position higher than the inert gas supply port for exhausting the inert gas; a second exhaust port for drawing a vacuum in the preliminary chamber; and a controller for performing control so that the inert gas supplied from the inert gas supply port is exhausted only from the first exhaust port, while maintaining the preliminary chamber drawn a vacuum from the second exhaust port at a specified pressure after rising of the pressure; and the method comprising:

a step for carrying the substrate holding jig holding multiple substrates into the processing chamber from the preliminary chamber and/or carrying out from the processing chamber into the preliminary chamber while exhausting from only the first exhaust port, the inert gas flowing upwards, supplied from the inert gas supply port in the preliminary chamber; and a step for processing the substrates in the processing chamber.

(11) The semiconductor device manufacturing method using the substrate treating apparatus according to any one of claims 2, 3, 4, 5, or 6 comprising a step for carrying a substrate holding jig holding the substrates into the processing chamber from the preliminary chamber and/or carrying out from the processing chamber into the preliminary chamber while exhausting from only the first exhaust port, the inert gas supplied from the inert gas supply port in the preliminary chamber and flowing upwards from below the substrate holding area to higher than the substrate holding area; and a step for processing the substrates in the processing chamber.

EFFECT OF THE INVENTION

In the invention according to the first aspect (1), inert gas supplied from the inert gas supply port flows from a side lower than the area where substrates are held in stacks on a substrate holding jig, towards a side higher than the area where substrates are supported in stacks on a substrate holding jig, and is exhausted from an exhaust port (first exhaust port). Foreign contaminants emitted from the mechanism can therefore be exhausted from the vent exhaust port by the flow and exhaust.

Moreover, during loading of the substrate holding jig and unloading of the substrate holding jig, the processing chamber is connected to the preliminary chamber, and the preliminary chamber and the atmosphere of the preliminary chamber are heated, so that the heated atmosphere flows from bottom to top. Therefore, the flow of inert gas from the inert gas supply port towards the first exhaust port (vent exhaust port) or from bottom to top is not disturbed and the purge can be performed. Foreign contaminants can consequently be exhausted with even greater effectiveness, and contamination of the wafers, the processing chamber, and the substrate holding jig area of the preliminary chamber can be effectively prevented.

BEST MODE FOR CARRYING OUT THE INVENTION

Figure 1A:
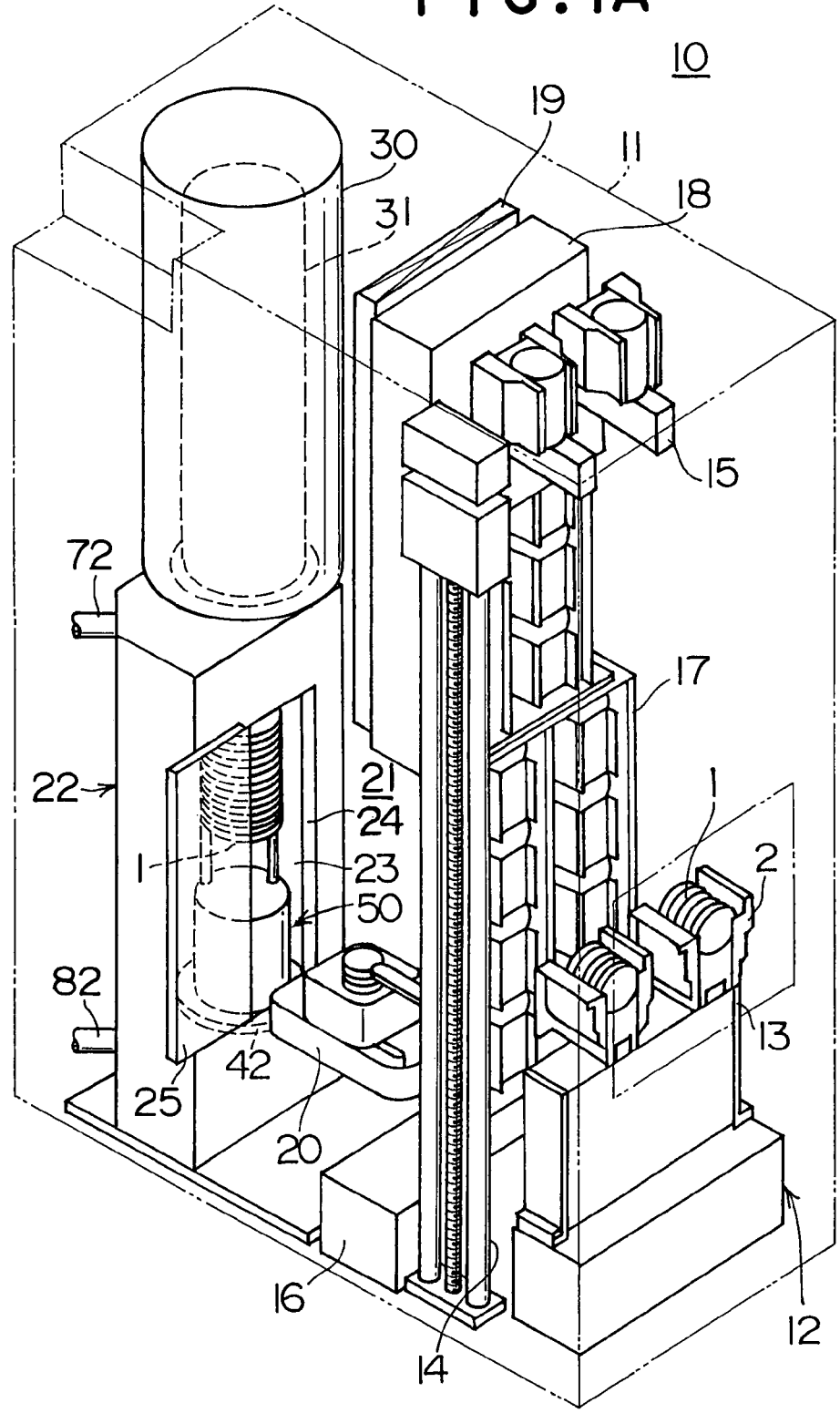
FIG. 1A is a partially abbreviated perspective view showing the load-lock CVD apparatus of one embodiment of this invention.

An embodiment of the present invention is described next while referring to the drawings.

The substrate treating apparatus of this embodiment of the present invention is a load-lock type CVD apparatus (load-lock batch type vertical hot wall depressurizing CVD apparatus). This load-lock type CVD apparatus is utilized in the film-forming process of the IC manufacturing method for forming a CVD film on a wafer serving as the substrate for processing.

The load-lock type CVD apparatus 10 contains a case 11 as shown in FIG. 1A. A cassette transfer unit 12 is installed on the front side of the case 11. This cassette transfer unit 12 contains a cassette stage 13 capable of holding two cassette units 2 serving as carriers for wafers 1.

The cassette 2 carried by the external transport device (not shown in drawing) is loaded in a vertical state (wafers 1 stored in the cassette 2 are in a perpendicular state) on the cassette stage 13. When the cassette 2 is loaded in a vertical state, the cassette stage 13 rotates 90 degrees to make the cassette 2 change to a horizontal state.

A cassette elevator 14 is installed on the rear side of the cassette stage 13. The cassette elevator 14 is structured to raise and lower a cassette transfer equipment 15.

A cassette rack 17 moved sideways by a slide stage 16 is installed at the rear side of the cassette elevator 14. A buffer cassette rack 18 is installed above the cassette rack 17.

A wafer transfer equipment 20 capable of rotating and rising/lowering is installed on the rear side of the cassette rack 17. The wafer transfer equipment 20 is structured to transfer the wafers 1 in one batch or one at a time.

A transfer chamber 21 is a space inside the case 11 where the wafer transfer equipment 20 is installed and capable of operating.

A cleaning unit 19 is installed on the rear side of the buffer cassette rack 18 for making clean air flow inside the case 11.

Figure 1B:
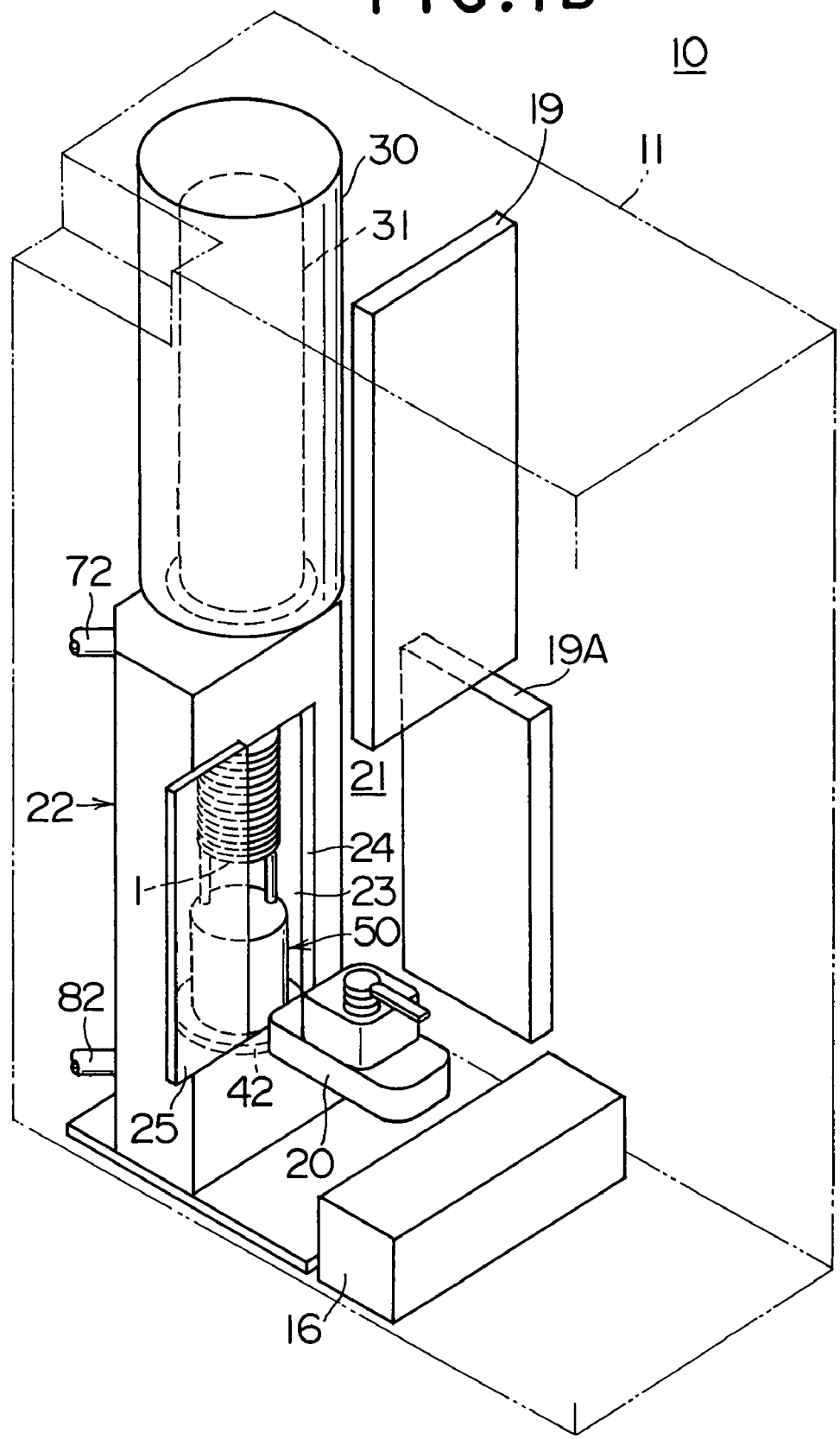
FIG. 1B is a partially abbreviated perspective view showing the side cleaning unit.

As shown in FIG. 1B, a side cleaning unit 19A is installed on the side wall of the case 11 to make clean air flow through the transfer chamber 21.

A pressure-resistant case 22 is installed on the lower section at the rear edge of the case 11. The pressure-resistant case 22 is formed in a case with structure capable of withstanding pressure (hereafter, called negative pressure) below atmospheric pressure (approximately 100,000 Pa). The pressure-resistant case 22 forms the standby chamber 23 serving as the load-lock type preliminary chamber.

A wafer loading/unloading opening 24 is formed in the front wall of the pressure-resistant chamber 22. A load-lock door 25 opens and closes the wafer loading/unloading opening 24.

Figure 2:
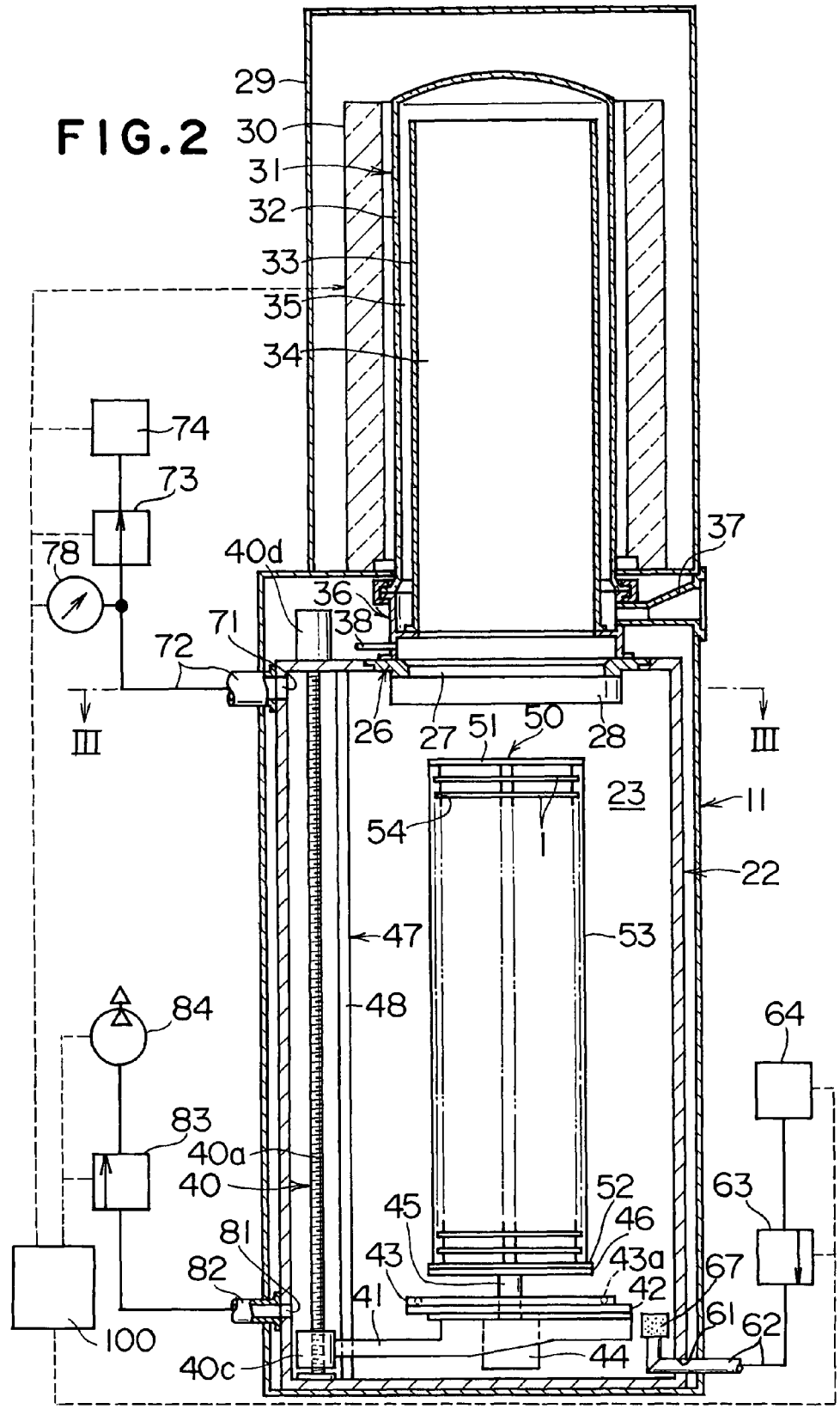
FIG. 2 is a rear cross sectional view showing that main essential section.

A flange 26 is formed on the ceiling wall of the pressure-resistant chamber 22 as shown in FIG. 2. A boat loading/unloading opening 27 for loading and unloading the boat serving as the substrate holding jig is formed in the flange 26. A shutter 28 serving as the load-lock type gate valve opens and closes the boat loading/unloading opening 27.

A heater unit chamber 29 is formed by the case 11 on the pressure-resistant chamber 22. A heater unit 30 serving as the heating means is installed vertically in the heater unit chamber 29.

Though a detailed description and drawing are omitted, the heater unit 30 includes a heat-insulating layer formed in a tubular shape using heat-insulating material, and a heater formed by a thermo-resistor element and installed on the inner circumferential surface of the heat insulating layer. A controller 100 regulates the heater unit 30 to heat the internal space to a uniform or a specified temperature distribution for example of 500° C. or higher.

A process tube 31 is concentrically installed inside the heater unit 30. The process tube 31 contains an inner tube 33 and an outer tube 32 both installed concentrically to each other.

The outer tube 32 is formed from quartz ($SiO_2$) or silicon carbide (SiC). The process tube 32 is formed in a cylindrical shape, sealed shut on the top end and opened on the bottom end.

The inner tube 33 is formed from quartz or silicon carbide in a cylindrical shape open on both the top and bottom ends.

A processing chamber 34 is formed from the hollow cylinder section of the inner tube 33. The structure of the processing chamber 34 allows carry-in of multiple wafers held concentrically in stacks on the boat. The opening on the bottom end of the inner tube 33 is a diameter larger than the maximum diameter of the wafer.

The gap between the outer tube 32 and the inner tube 33 forms a ring-shaped exhaust path 35.

Figure 5:
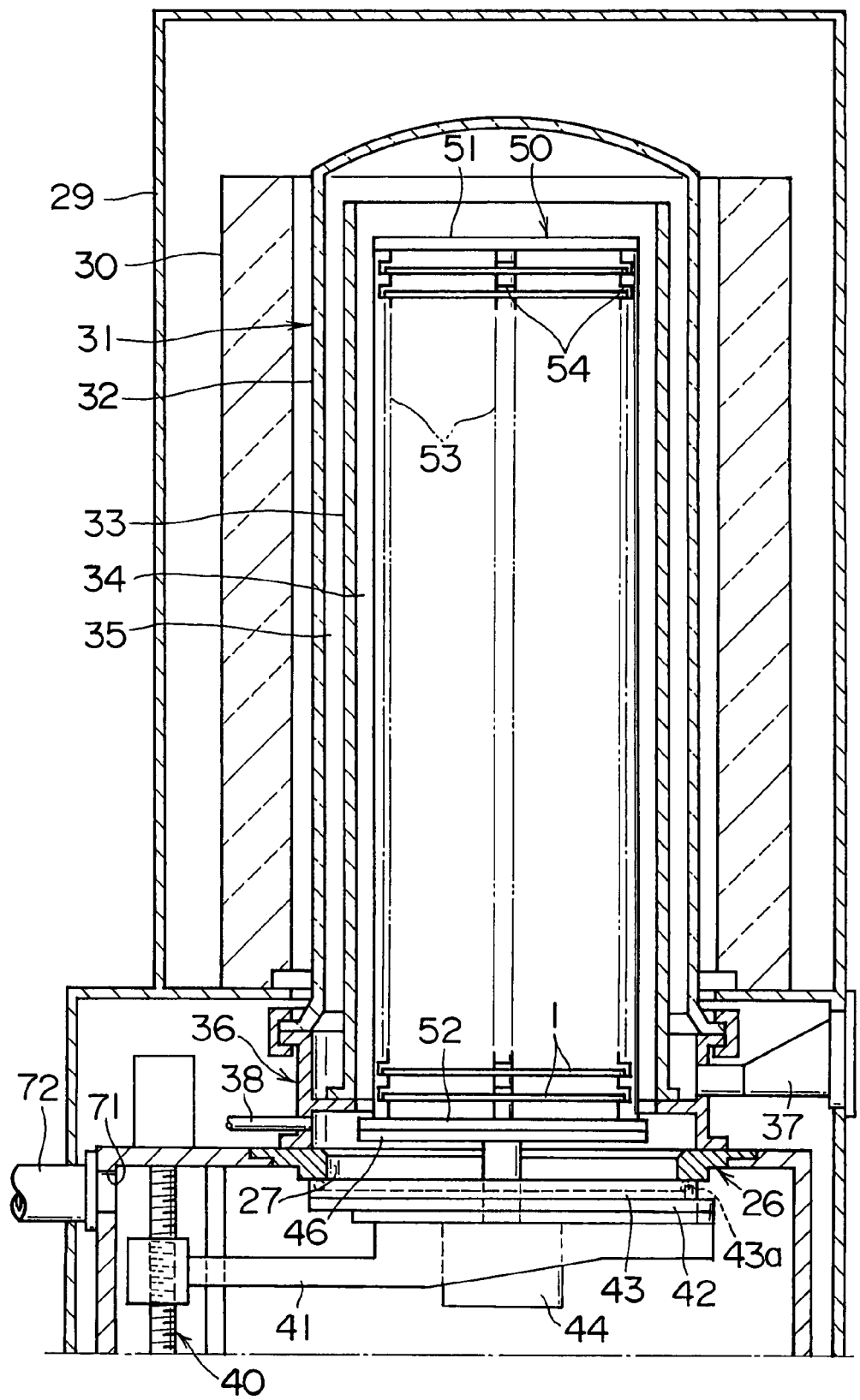
FIG. 5 is a partially abbreviated rear cross sectional view showing the state during boat loading.

A manifold 36 at the bottom end of the outer tube 32 is installed concentrically with the outer tube 32 as shown in FIG. 5. The manifold 36 is formed from stainless steel in a cylindrical shape open at the top and bottom ends.

The manifold 36 is supported by the flange 26 formed on the pressure-resistant case 22, to perpendicularly support the outer tube 32.

One end of a large diameter exhaust pipe 37 is connected to the upper side section of the side wall of the manifold 36. The other end of the exhaust pipe 37 connects to a vacuum exhaust device (not shown in the drawings). The exhaust pipe 37 exhausts the exhaust path 35 formed by the gap between the outer tube 32 and the inner tube 33.

One end of a gas supply pipe 38 is inserted in the lower space of the processing chamber 34 so as to connect to the interior of the processing chamber 34. The other end of the gas supply pipe 38 is connected to a gas supply device (not shown in drawing) for supplying inert gas such as raw material gas or nitrogen gas, or to a gas supply device (not shown in drawing) for supplying process gas for processing the wafers 1.

The substrate holding jig mechanism installed in the standby chamber 23, includes a drive unit, and a boat placement unit connected to the drive unit. The boat is placed in this boat placement unit.

Figure 3:
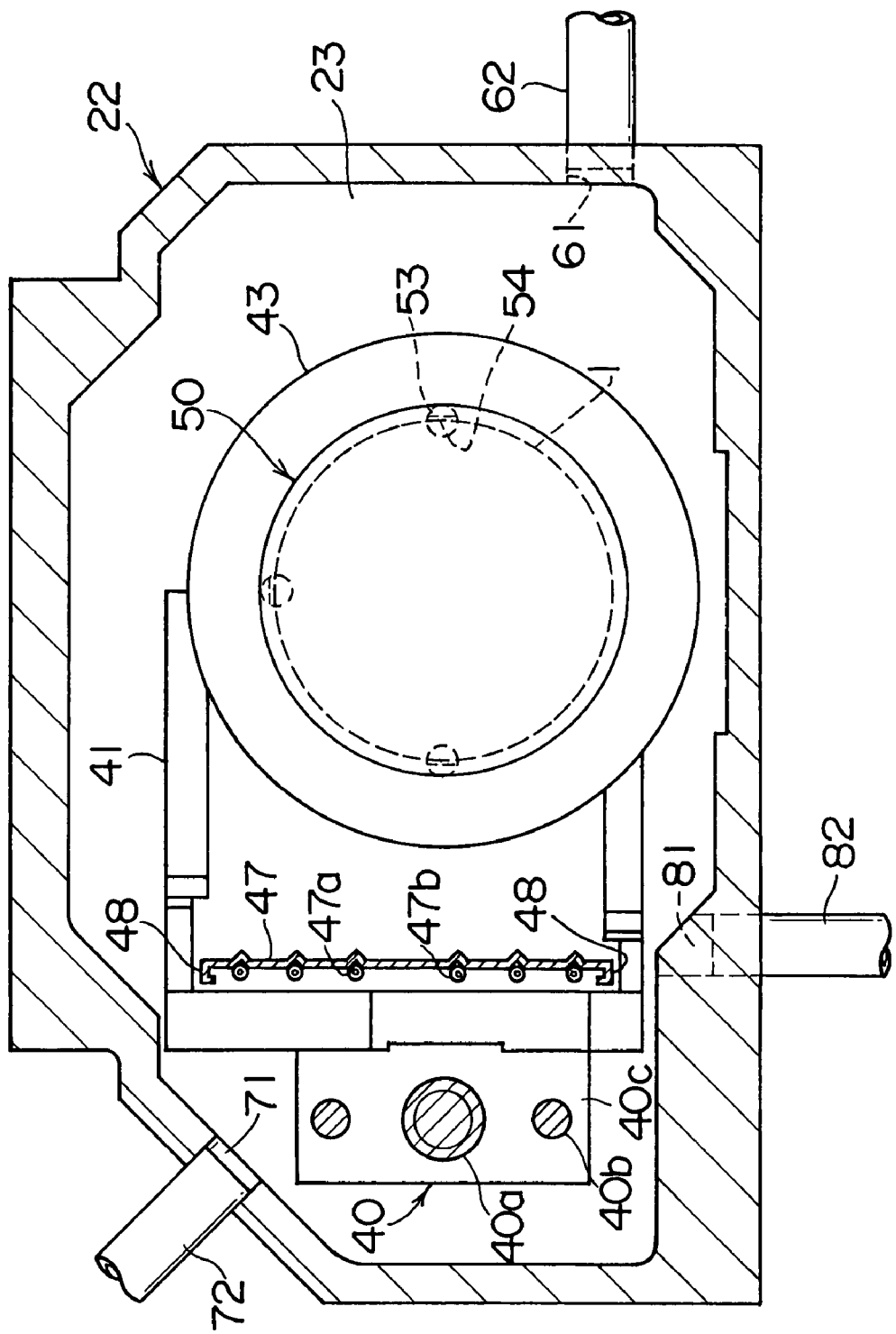
FIG. 3 is a cross sectional view taken along lines III-III of FIG. 2.

As shown in FIG. 2 and FIG. 3, the drive unit inside the standby chamber 23, is a boat elevator 40 made up of a feed screw shaft 40a, a guide shaft 40b, a raise/lower base 40c and a motor 40d, etc. The motor 40d drives the feed screw shaft 40a.

An arm 41 connects to the raise/lower base 40c of the boat elevator 40, and a base 42 is provided on this arm 41. A seal cap 43 is supported horizontally on this base 42.

A seal ring 43a is installed on the outer periphery of this seal cap 43. This seal cap 43 is formed in a disk shape approximately equivalent to the outer diameter of the flange 26.

This seal cap 43 closes the bottom end of the flange 26 via the seal ring 43a, and is structured so as to seal the boat loading/unloading opening 27.

A rotating shaft 45 is inserted perpendicularly along the center line of the base 42. This rotating shaft 45 is supported for free rotation by a bearing device (not shown in drawing). The rotating shaft 45 is rotated by a boat rotation drive motor 44.

A boat mount 46 is clamped horizontally on the upper end of the rotating shaft 45. A boat 50 stands perpendicularly on the boat mount 46.

The arm 41, base 42, seal cap 43, boat rotation drive motor 44, rotating shaft 45, and boat mount 46 as well as the seal ring 43a constitute the boat placement unit for placement of the boat 50 in the substrate holding jig mechanism.

The boat rotation drive motor 44 relating to the rotation mechanism may be omitted. In that case, the rotating shaft 45 is a fixed shaft that does not rotate.

The boat 50 contains a pair of end plates 51, 52 at top and bottom, and multiple support members 53 installed perpendicularly between both end plates 51, 52. Multiple support grooves 54 are respectively formed at equidistant intervals longitudinally on each of the support members 53. The mutual support grooves 54 of each support member 53 are mutually positioned with their openings within the same plane.

The outer circumferential section of the wafer 1 are inserted into between the multiple support grooves 54 so that the wafers 1 are arrayed horizontally and concentrically, and are supported in a stack in the boat 50.

As shown in FIG. 2 and FIG. 3, a partition plate 47 is perpendicularly installed in the standby chamber 23 to separate the standby chamber 23 into two sections. This partition plate 47 separates the standby chamber 23 into a placement area (hereafter called the boat elevator area) for the boat elevator 40 serving as the drive unit for the substrate holding jig mechanism; and the area (hereafter, called the boat placement area) for placing the boat 50 serving as the substrate holding jig in the substrate holding jig mechanism.

A pair of perpendicularly narrow gaps 48 are each formed between the side wall inner surfaces of the standby chamber 23 and both sides of the partition plate 47. These narrow gaps 48, 48 are set as narrowly as possible within a range to allow raising and lowering of the arm 41. In other words, the arm 41 is formed in a two-limb shape with a wide gap and narrow width, and is inserted in both respective gaps 48, 48.

Multiple vertical grooves 47a are formed in the middle section of the partition plate 47 as shown in FIG. 3. Cooling water pipes 47b are installed respectively along these vertical grooves 47a.

These cooling water pipes 47b render the effect of reducing the effects of heat from the heater unit 30, during boat unloading, etc.

These vertical grooves 47a may be omitted.

An inert gas supply port 61 is formed on the side lower than the area (hereafter named, substrate holding area) for the multiple wafers (substrates) held in a stack in the boat 50 in the boat placement area of the pressure-resistant case 22. This inert gas supply port 61 supplies inert gas such as nitrogen gas to the standby chamber 23.

An inert gas supply line 62 connects to the inert gas supply port 61. An inert gas supply device 64 capable of adjusting the gas flow rate via a stop valve 63 is connected to the inert gas supply line 62.

A controller 100 controls the inert gas supply device 64 and the stop valve 63.

As shown in FIG. 2, the inert gas supply line 62 extends to the vicinity of the side of the seal cap 43, and a brake filter 67 may be installed at that tip. The brake filter 67 is a porous material member. Inert gas passing through that porous material member is supplied from the porous material member into the standby chamber 23.

A vent exhaust port 71 serving as the first exhaust port for exhausting inert gas from the standby chamber 23 is formed on the side above the substrate holding area in the boat elevator placement area of the pressure-resistant case 22. A vent line 72 connects to the vent exhaust port 71. An exhaust duct device 74 for the IC manufacturing plant is connected via a stop valve 73 to the vent line 72.

A pressure meter 78 is installed on the vent line 72 between the standby chamber 23 and the stop valve 73.

When the pressure meter 78 detects a pressure higher than atmospheric pressure, that pressure meter 78 notifies the controller 100 that the pressure is higher than atmospheric pressure. Conditions that allow opening of the stop valve 73 are now established so that the stop valve 73 opens when the controller 100 sends an open signal.

When the pressure meter 78 detects a pressure below atmospheric pressure, then conditions to open the stop valve 73 have not been established so that the controller 100 emits no open signal, and the stop valve 73 closes; or the controller 100 emits a close signal, and the stop valve 73 closes.

Instead of connecting an exhaust duct device 74 for the IC manufacturing plant to the vent line 72, it may be connected to a vacuum pump via the exhaust flow rate adjuster.

A vacuum exhaust port (second exhaust port) 81 for drawing a vacuum in the standby chamber 23 is provided at a position facing the gap 48 on the bottom end of the pressure-resistant case 22 as shown in FIG. 2 and FIG. 3. An exhaust line 82 is connected to the vacuum exhaust port 81.

An exhaust device 84 made up of a vacuum pump is connected via a stop valve 83 to the exhaust line 82. The controller 100 controls the exhaust device 84 and the stop valve 83.

The reason for providing the vacuum exhaust port 81 on the bottom end of the pressure-resistant case 22, namely the side lower than the substrate holding area, is that exhaust can be performed without allowing particles that accumulated by gravity at the bottom of the standby chamber 23, to float upwards to the wafer 1 during vacuum exhausting of the interior of the standby chamber 23.

Unlike exhaust carried out near atmospheric pressure, during vacuum-exhaust there is a large quantity of exhaust in the initial stage, and the exhaust gas flow speed is fast during the exhaust process so that the effect causing particles to float upwards is extremely strong.

The film-forming process in the IC manufacturing method of one embodiment of this invention using the load-lock type CVD apparatus with the above disclosed structure is described next.

The cassette 2 storing the multiple wafers 1, is supplied by an external transport device to the cassette stage 13 of the cassette transfer unit 12. The cassette stage 13 rotates 90 degrees to place the supplied cassette 2 in a horizontal position.

The cassette 2, now in a horizontal position is transferred to the cassette rack 17 or the buffer cassette rack 18 by the cassette transfer device 15.

The wafers 1 stored in the cassette 2 for film-forming are carried into the standby chamber 23 by the wafer transfer equipment 20 via the wafer loading/unloading opening 24 of the pressure-resistant case 22, and charged into the boat 50.

Figure 4:
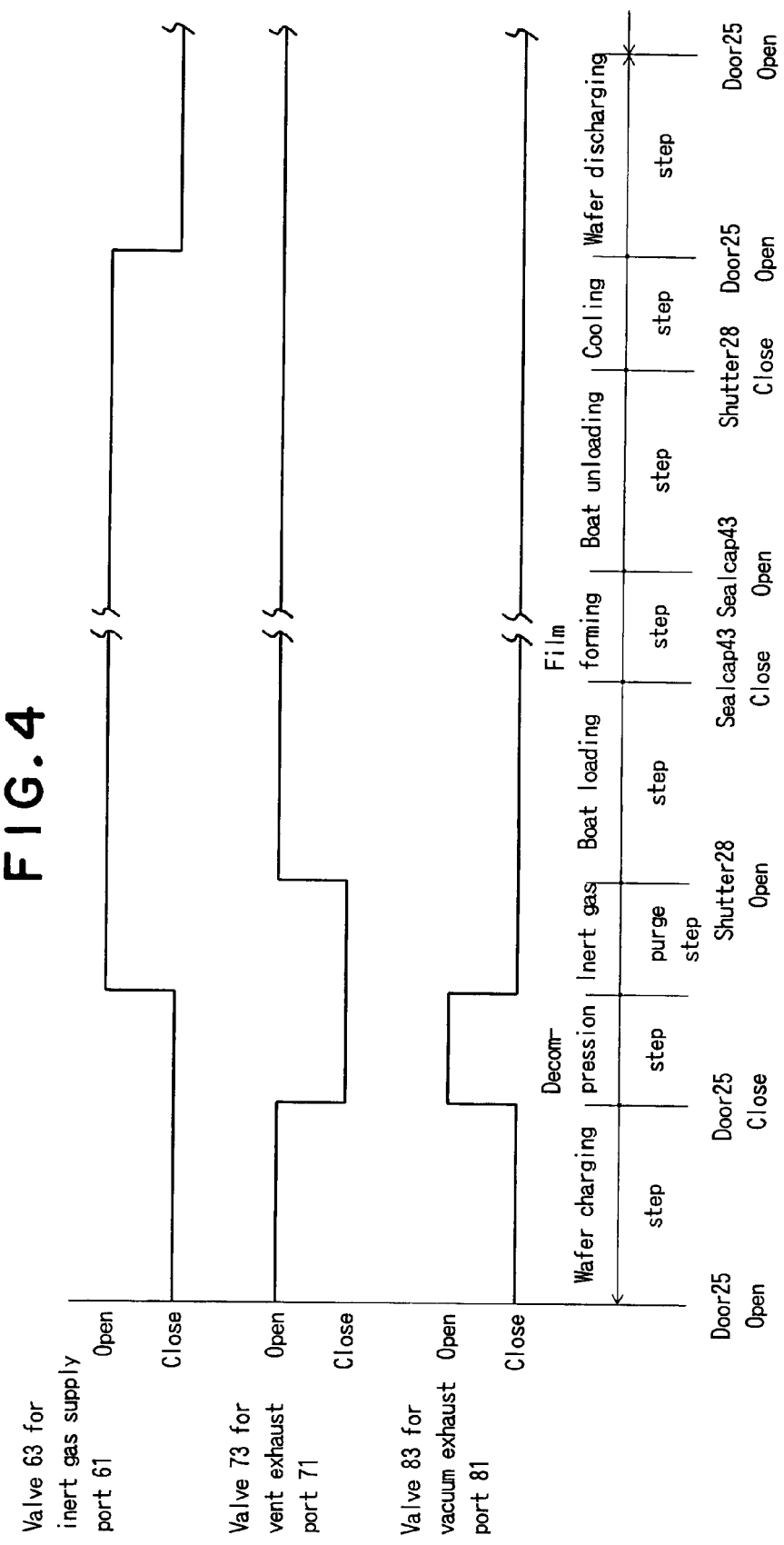
FIG. 4 is a timing chart showing the opening and closing of a stop valve for the inert gas supply port, a stop valve for the vent exhaust port, and a stop valve for the vacuum exhaust port.

In this charging step, the wafer loading/unloading opening 24 is opened so that the stop valve 63 of the inert gas supply port 61 is closed as shown in FIG. 4, the supply of inert gas is stopped, the stop valve 73 of the vent exhaust port 71 is opened, and the atmosphere within the standby chamber 23 is vented. The stop valve 83 of the vacuum exhaust port 81 is closed, and drawing the vacuum stops. The atmosphere of the transfer chamber 21 is supplied via the wafer loading/unloading opening 24 to the standby chamber 23, and is exhausted from the vent exhaust port 71.

Clean air is supplied to the transfer chamber 21 from the side cleaning unit 19A so there is no source of contamination even if the clean air enters the transfer chamber 21. Clean air also flows from the placement area of the boat 50 towards the placement area of the boat elevator 40 so that foreign contaminants and particles emitted from the boat elevator 40 do not flow into the placement area of the boat 50, to suppress contamination.

The flow of gas from the placement area of the boat 50 to the boat elevator 40 can be maintained even if inert gas is continuously supplied from the inert gas supply port 61, so that inert gas may be continuously supplied.

Incidentally, in this case, the closing of the boat loading/unloading opening 27 by the shutter 28 as shown in FIG. 2 prevents the high-temperature atmosphere within the processing chamber 34 from flowing into the standby chamber 23. The already charged wafers 1 or the wafers 1 being charged are therefore not exposed to a high-temperature atmosphere, and problems occurring from damage due to natural oxidation from exposure of the wafers 1 to a high-temperature atmosphere are prevented.

When the pre-specified number of wafers 1 are charged into the boat 50, the load-lock door 25 closes the wafer loading/unloading opening 24.

Next, as shown in FIG. 4, the stop valve 73 of the vent exhaust port 71 is closed, the stop valve 83 of the vacuum exhaust port 81 is opened and a vacuum is drawn by the exhaust device 84, and the pressure in the standby chamber 23 is depressurized to a specified pressure (for example, 200 Pa) (depressurizing step).

In this case, the supply of inert gas is stopped by closing the stop valve 63 of the inert gas supply port 61. An exhaust device (such as a turbo molecular pump) may be utilized to supply the inert gas at an extremely slow pace. The oxygen ($O_2$) and moisture in the standby chamber 23 is removed by this vacuum-exhaust.

After reducing the pressure in the standby chamber 23 to the specified pressure, the stop valve 83 for the vacuum exhaust port 81 is closed as shown in FIG. 4, drawing a vacuum by the vacuum device 84 is stopped, the stop valve 63 of the inert gas supply port 61 is opened to supply inert gas (for example, 100 to 200 liters per minute of nitrogen gas) to the standby chamber 23, and the air in the standby chamber 23 is expelled by the inert gas (inert gas purge step).

When the atmosphere in the standby chamber 23 is replaced by the inert gas, and the pressure meter 78 detects that the pressure in the standby chamber 23 has returned to atmospheric pressure, the stop valve 73 of the vent exhaust port 71 opens to exhaust the gas, and maintain the standby chamber 23 near atmospheric pressure. The atmosphere that entered the standby chamber 23 during charging of the wafers 1 into the boat 50 is in this way exhausted from the standby chamber 23.

The boat loading/unloading opening 27 serving as the furnace opening for the processing chamber 34 is then opened by the opening of the shutter 28. The atmosphere in the processing chamber 34 is in that case replaced beforehand by the inert gas, and the pressure is slightly higher than the pressure in the standby chamber 23 so that the atmosphere in the standby chamber 23 is prevented from penetrating into the processing chamber 34.

Moisture and oxygen are removed beforehand from the standby chamber 23 so that no natural oxidation film is generated on the surface of the wafer 1, even if the wafers 1 are exposed to radiant heat from the processing chamber 34.

Next, the boat 50 supported on the arm 41 of the boat elevator 40 via the base 42 and the rotation shaft 45 and the boat mount 46, are carried in from the boat loading/unloading opening 27 to the processing chamber 34 of the process tube 31 (boat loading).

As shown in FIG. 5, when the boat 50 then reaches the upper limit position, the seal ring 43a on the periphery of the upper surface of the seal cap 43 closes the boat loading/unloading opening 27 in a sealed state so that the processing chamber 34 of the process tube 31 is closed in an air-tight state.

In this boat loading step, as shown in FIG. 4, the stop valve 63 of the inert gas supply port 61 opens to allow the supply of inert gas (nitrogen gas from 100 to 200 liters per minute). The stop valve 73 of the vent exhaust port 71 opens, and the atmosphere inside the standby chamber 23 is exhausted. The stop valve 83 of the vacuum exhaust port 81 is closed.

Inert gas (for example, nitrogen gas from 5 to 50 liters per minute) is also supplied to the processing chamber 34 from the gas supply line 38. The standby chamber 23 and the processing chamber 34 are then maintained near atmospheric pressure.

In this boat loading step, the inert gas supplied from the inert gas supply port 61, flows upward from the side lower than the substrate holding area serving as the area for the multiple substrates held in a stack in the boat 50 to the side higher than the substrate holding area, and is exhausted from the vent exhaust port 71 (first exhaust port). The exhaust from the vacuum exhaust port 81 (second exhaust port) is at this time stopped by the stop valve 83. The exhaust therefore only passes from the vent exhaust port 71, and exhaust is carried out only from the upper side of the substrate holding area. The flow of inert gas from the side lower than the substrate holding area to the side higher than the substrate holding area is therefore orderly with no turbulence.

The furnace opening of the processing chamber 34 is opened by the opening of the shutter 28 so that the radiant heat from the heater unit 30 radiates into the standby chamber 23 via the furnace opening of the processing chamber 34. The standby chamber 23 and the atmosphere in the standby chamber 23 are heated and reach a high temperature, rendering the effect that the atmosphere in the standby chamber 23 flows from bottom to top.

However, in this embodiment, the flow direction from the force of the exhaust is substantially the same as the flow direction of the atmosphere heated in the standby chamber 23 so that the flow of the heated atmosphere causes no turbulence in the gas flow due to the exhaust force.

Supposing that the inert gas flows downward from above the standby chamber 23, the flow of the heated atmosphere in the standby chamber 23 then attempts to flow in a direction substantially opposite the flow of the inert gas. Therefore, the gas flow due to the exhaust force in the standby chamber 23 is disturbed, and foreign contaminants from the boat elevator 40 of the standby chamber 23, are carried along from the boat elevator area to the boat placement area and contaminate the wafers 1.

However, this type of problem can be effectively suppressed in this embodiment, so that the wafers 1 are maintained in a clean state over the entire substrate holding area.

Moreover, in this case the inert gas supply port 61 is provided in the boat placement area, and the vent exhaust port 71 is provided in the boat elevator area so that the inert gas flows from the boat placement area to the boat elevator area. Foreign contaminants from the boat elevator 40 are therefore prevented from being carried into the boat placement area and contaminating the wafers 1.

The processing chamber 34 of the process tube 31 is afterwards closed in an airtight state, and exhausted via the exhaust pipe 37 to reach the specified pressure, heated to a specified temperature by the heater unit 30, and then supplied with the specified raw material gas via the gas supply pipe 38 just at the specified flow rate.

The wafers 1 are in this way thermally processed according to the preset processing conditions.

At this time, the boat rotation drive motor 44 rotates the boat 50 so that the raw material gas makes uniform contact with the surface of the wafer 1 and therefore the CVD film is uniformly formed on the wafer 1.

During this period as shown in FIG. 4, the stop valve 63 of the inert gas supply port 61 is opened, the stop valve 73 of the vent exhaust port 71 is opened, the atmosphere inside the standby chamber 23 is exhausted, and also the stop valve 83 of the vacuum exhaust port 81 is closed to maintain the atmosphere in the standby chamber 23 near atmospheric pressure.

The boat 50 supported via the seal cap 43 on the arm 41 of the boat elevator 40 is then carried out from the processing chamber 34 of the process tube 31 when the preset processing time elapses (boat unloading).

Then, in this boat unloading step as shown in FIG. 4, the stop valve 63 of the inert gas supply port 61 is opened, and inert gas (nitrogen gas of 100 to 200 liters per minute) is supplied, the stop valve 73 of the vent exhaust port 71 is opened, to exhaust the atmosphere within the standby chamber 23. The stop valve 83 of the vacuum exhaust port 81 is closed.

Inert gas is also supplied (nitrogen gas of 5 to 50 liters per minute) to the processing chamber 34 from the gas supply pipe 38. The standby chamber 23 and the processing chamber 34 are maintained at atmospheric pressure.

In this boat unloading step, the inert gas supplied from the inert gas supply port 61 flows from the side lower than the substrate holding area to the side higher than the substrate holding area, and is exhausted from the vent exhaust port 71 (first exhaust port). The exhaust from the vacuum exhaust port 81 (second exhaust port) is stopped at this time by the stop valve 83. Therefore, exhaust is only carried out by the vent exhaust port 71, with the exhaust flowing only from the upper side of the substrate holding area. The flow of inert gas from the side lower than the substrate holding area to the side higher than the substrate holding area is therefore orderly with no turbulence.

The furnace opening of the processing chamber 34 is opened by the seal cap 43 opening so that the radiant heat from the heater unit 30 radiates into the standby chamber 23 via the furnace opening of the processing chamber 34. Moreover, the boat 50 and the wafers 1 heated by the heater unit 30 in the processing chamber 34 (for example to 500° C. or higher) are carried out from the processing chamber 34 so that the radiant heat from the boat 50 and the wafers 1 and the heat convection heat the standby chamber 23 and the atmosphere in the standby chamber 23 to a high temperature. Moreover, this heated boat 50 and the wafers 1 are carried to the lower side of the standby chamber 23 in a state where the arm 41 of the substrate holding jig mechanism is lowered to the vicinity of the bottom of the standby chamber 23 (the position where the boat unloading was completed). The effect of the flow of atmosphere within the heated standby chamber 23 from the lower side of the standby chamber 23 to the upper side (ceiling plate side of the standby chamber) is therefore extremely large compared to the boat loading step.

For example, the heated boat mount 46 and the rotating shaft 45 are at the side lower than the substrate holding area so that the atmosphere of the standby chamber 23 flows from the side lower than the substrate holding area to the side higher than the substrate holding area.

However, in the present embodiment, the flow direction due to the exhaust force, and the flow direction of the heated atmosphere in the standby chamber 23 are substantially the same direction across the entire area of at least the substrate holding area so that there is no turbulence in the gas flow of the inert gas at least in the substrate holding area.

Assuming a flow of inert gas from the top of the standby chamber 23 to bottom, then the effect that the atmosphere of the heated standby chamber 23 attempts to flow in the direction substantially opposite the flow of the inert gas from the upper section to the bottom section becomes extremely larger than during boat loading. Consequently, there is a large turbulence in the gas flow due to the force of the exhaust of the inert gas in the standby chamber 23, and foreign contaminants from the boat elevator 40 of the standby chamber 23 are carried from the boat elevator 40 area to the boat placement area, as well as the processing chamber 34, and the amount of contamination on the wafers 1 greatly increases.

However, the present embodiment is capable of effectively suppressing this type of problem, and capable of maintaining the wafers 1 in a clean state across the entire substrate holding area.

Moreover, the inert gas supply port 61 is in this case provided in the boat placement area, and the vent exhaust port 71 is provided in the boat elevator area so that inert gas is exhausted so as to flow from the boat placement area to the boat elevator area. The contamination of the wafers 1 by foreign contaminants carried to the boat placement area from the boat elevator 40 is prevented.

The shutter 28 closes the boat loading/unloading opening 27 when the boat 50 is carried out from the processing chamber 34 to the standby chamber 23.

Next, as shown in FIG. 4, the stop valve 73 of the vent exhaust port 71 is opened, the stop valve 63 of the inert gas supply port 61 is opened, and inert gas is supplied to the standby chamber 23. The fresh inert gas flowing into the standby chamber 23 effectively cools the processed wafers 1 group that is at a high temperature.

When the temperature of the processed wafers 1 group lowers to the specified temperature (for example, temperature capable of preventing a natural oxidation film from forming on the surface of the wafer 1), the load-lock door 25 opens the wafer loading/unloading opening 24 of the standby chamber 23.

In this case, as shown in FIG. 4, the stop valve 63 of the inert gas supply port 61 is closed, and the stop valve 73 of the vent exhaust port 71 is kept open. The standby chamber 23 is in this way maintained at atmospheric pressure, and clean air from the cleaning unit 19 flows from the wafer loading/unloading opening 24 into the standby chamber 23, and is exhausted from the vent exhaust port 71.

The inert gas may be continuously supplied from the inert gas supply port 61 to the standby chamber 23.

The processed wafers 1 in the boat 50 are next discharged by the wafer transfer equipment 20 and stored in an empty cassette 2.

The cassette 2 storing the specified number of processed wafers 1 is transferred to the cassette transfer unit 12 by the cassette transfer equipment 15.

When this wafer discharging step is completed, the next batch of wafers 1 from the cassette 2 are charged into the boat 50 by the wafer transfer equipment 20.

By hereafter repeating the above described action, the wafers 1 in batches for example of 25 wafers, 50 wafers, 75 wafers, 100 wafers, or 150 wafers each may be batch processed in the load-lock type CVD apparatus 10.

Figure 6:
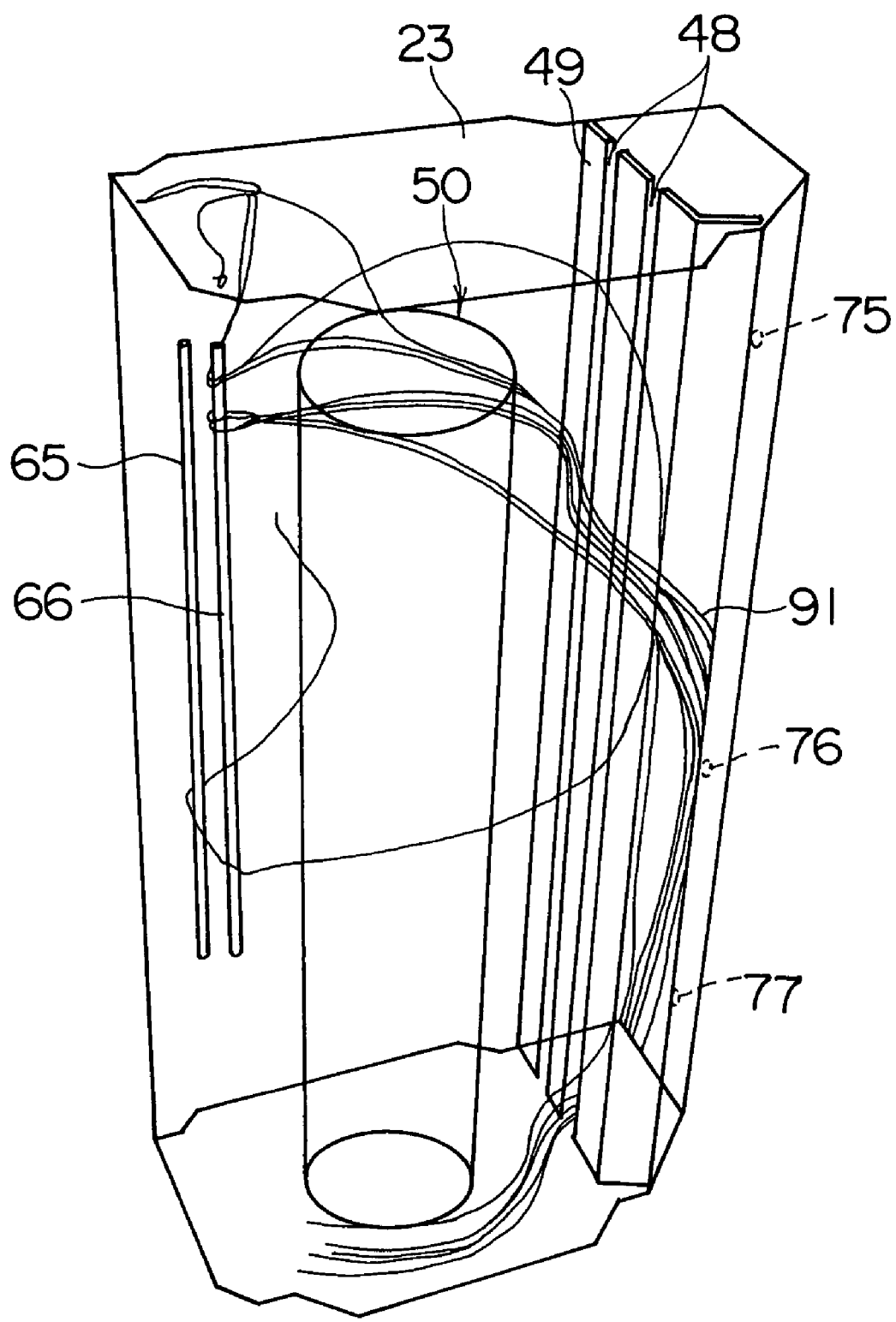
FIG. 6 is a diagram showing the flow of gas in the load-lock type CVD apparatus as a comparison sample.

FIG. 6 is a drawing for describing the flow of inert gas in the standby chamber 23 of the conventional device.

Inert gas supply nozzles 65, 66 are installed in the boat placement area of the standby chamber 23. These inert gas supply nozzles 65, 66 supply the inert gas. These inert gas supply nozzles 65, 66 are porous nozzles with multiple supply holes formed along the height direction. Vent exhaust ports 75, 76, 77 provided at the upper, middle and bottom levels on the boat elevator area are for exhausting the atmosphere within the standby chamber 23.

A partition plate 49 is installed to partition the boat placement area and the boat elevator placement area. A pair of gaps 48, 48 are adjacently provided in the center of this partition plate 49.

The flow of inert gas when inert gas was supplied only from two locations on the upper part of the inert gas supply nozzle 66 is shown by the flow lines 91. The inert gas flows through the pair of gaps 48, 48 of the partition plate 49 and flows from the boat placement area to the boat elevator placement area.

A portion of the inert gas is exhausted from the vent exhaust port 76 but inert gas that was not exhausted flows downward, again passing through the pair of gaps 48, 48, and flowing from the boat elevator placement area to the boat area.

By merely viewing the case where the inert gas is supplied only from the two locations on the upper part of the inert gas supply nozzle 66, one can understand that the atmosphere in the boat elevator area flows into the boat area, and that contaminant substances caused by vapor from grease and particles generated from the boat elevator 40 contaminate the wafers 1.

The wafer processing environment is contaminated by these contaminant substances entering the processing chamber 34, and further this increases the amount of contamination on the wafers 1.

Figure 7:
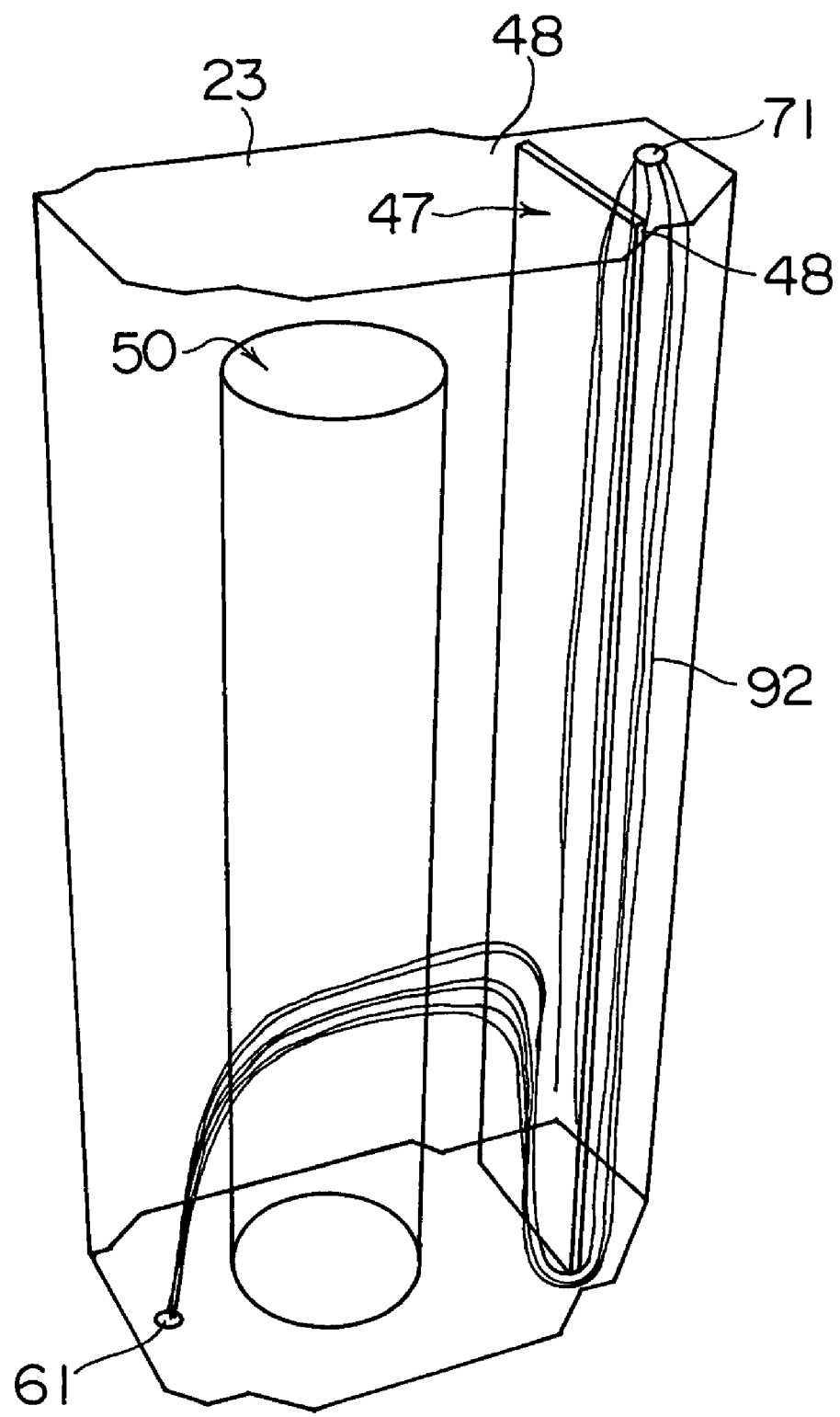
FIG. 7 is a diagram showing the flow of gas in this embodiment.

FIG. 7 is a drawing for describing the flow of inert gas in the standby chamber 23 in the present embodiment.

An inert gas supply port 61 is provided on the bottom edge of the boat placement area of the standby chamber 23. Inert gas is supplied from this inert gas supply port 61. The vent exhaust port 71 provided on the top edge of the boat elevator area, exhausts the atmosphere of the standby chamber 23.

A partition plate 47 is installed to partition the boat placement area and the boat elevator placement area. A pair of gaps 48, 48 is provided between the side wall of the standby chamber 23 and the left/right edges of the partition plate 47.

When inert gas flows from the inert gas supply port 61, this inert gas flows as shown by the flow lines 92. In other words, the inert gas rises from the bottom of the boat area, flows horizontally in the boat area at the lower side of the boat 50 and when it reaches the partition plate 47, flow downward along the partition plate 47, passes through the gap 48 provided between the lower side of the partition plate 47 and the side wall of the standby chamber 23, and then flows from the boat area to the boat elevator area. The inert gas then flows upwards towards the vent exhaust port 71 provided on the top edge of the boat elevator area in the boat elevator area, and is exhausted from the vent exhaust port 71.

Unlike the conventional device shown in FIG. 6, in the present embodiment in this way the flow of inert gas from the boat elevator area to the boat area eliminates. The wafers 1 are therefore not contaminated by contaminant substances caused by vapor from grease and particles generated from the boat elevator 40. Also, no contaminant substances do not enter the processing chamber 34, and the environment for processing the wafers 1 can be kept clean.

Particles that sunk under their own weight to the bottom of the standby chamber 23 might possibly be floated upwards, so a break filter 67 may be utilized as shown in FIG. 2 to make the inert gas flow from the side of the seal cap 43.

The break filter 67 is a porous material member that is capable of supplying inert gas in multiple directions. Therefore, an even greater quantity of inert gas can be supplied while suppressing the inert gas flow speed even further. The gas flow to allow floating upwards of the particles that sunk under their own weight to the bottom of the standby chamber 23 can therefore be effectively suppressed.

The reason that the gaps 48, 48 are provided in different positions in FIG. 6 and FIG. 7 is described next.

Namely, the pair of gaps 48, 48 are provided in the center section in the conventional device in FIG. 6 so that when the inert gas flows from the boat elevator area to the boat area, inert gas containing contaminant substances might possibly be blown directly on the wafers 1 loaded on the boat 50, making the contamination even worse.

Therefore, in the present embodiment, the pair of gaps 48, 48 are provided between the side walls of the standby chamber 23 and the partition plate 47, on the sides farthest away from the partition plate 47 as shown in FIG. 7, in order to prevent inert gas containing contaminant substances from blowing directly on the wafers 1 and to suppress contamination of the wafers as much as possible even where the inert gas flows for example from the boat elevator area to the boat area.

The present embodiment renders the following effects.

1) By arranging the inert gas supply port on the bottom edge of the boat placement area of the standby chamber and, arranging the vent exhaust port on the top edge of the boat elevator placement area of the standby chamber, the phenomenon that foreign contaminants such as vapor from grease or particles emitted from the boat elevator enter the processing chamber, or particles that sunk under their own weight to the bottom of the standby chamber float upwards can be prevented. Consequently, contamination of the processing chamber by foreign contaminants from the boat elevator can be prevented, and particles can also be prevented from adhering to the wafer.

2) By preventing contamination of the processing chamber from foreign contaminants carried from the boat elevator, and by preventing particles from adhering to the wafers; the production yield of the load-lock type CVD apparatus can be improved to render the effect that the production yield of the film forming process and therefore the manufacturing method for IC is improved.

The present invention is not limited by the above described embodiment and may of course include changes and variations not departing from the scope or spirit of this invention.

An inert gas supply port and vent exhaust port as well as vacuum exhaust port were for example provided one each, however, the invention is not limited to one each and may arrange multiple ports of each type.

If the exhaust quantity is adjusted lower than the inert gas supply quantity, when raising the pressure in the standby chamber 23 from a vacuum state to atmospheric pressure, then the purge can be made with inert gas even when raising the pressure.

In this case, the vacuum-exhaust of the standby chamber 23 is performed from the second exhaust port, as described previously, so that particles that settled to the bottom of the standby chamber 32 are not floated upwards.

Also, the first exhaust port is utilized when raising the pressure while exhausting with inert gas. Even in this case, the pressure in the standby chamber 23 during exhaust from the second exhaust port is lower than the pressure in the standby chamber 23 during exhaust from the first exhaust port.

The description in the embodiment utilized a load-lock type CVD apparatus. However, the present invention also may apply to substrate treating apparatus in general such as load-lock type oxidation apparatus, diffusion apparatus and annealing apparatus.

The above embodiment described a film-forming process for forming a CVD film on wafers in the IC manufacturing method. However, the present invention may also apply to general processes in semiconductor device manufacturing methods such as oxidation processes, diffusion processes, reflow processes, annealing processes, and other thermal treatment processes.

The invention claimed is:

1. A substrate treating apparatus comprising:
a processing chamber for storing and processing a substrate;

a preliminary chamber continuously arranged to the processing chamber;

a substrate holding jig mechanism for carrying in and/or carrying out a substrate holding jig for holding multiple substrates to and from the processing chamber;

an inert gas supply port for supplying inert gas to the preliminary chamber;

a first exhaust port provided in the preliminary chamber at a position higher than the inert gas supply port for exhausting the inert gas;

a second exhaust port for drawing a vacuum in the preliminary chamber; and a controller for performing control so that the inert gas supplied from the inert gas supply port is exhausted only from the first exhaust port, while maintaining the preliminary chamber drawn a vacuum from the second exhaust port at a specified pressure after rising of the pressure.

2. The substrate treating apparatus according to claim 1, comprising the preliminary chamber containing an exhaust port separate from the first exhaust port and lower than the top edge of the substrate holding area; and a controller for performing control when the substrate holding jig holding the substrates is carried into the processing chamber from the preliminary chamber and/or is carried out from the processing chamber into the preliminary chamber, so that inert gas supplied from the inert gas supply port flows from below the substrate holding area to higher than the substrate holding area, and is exhausted only from the first exhaust port higher than the substrate area among the multiple exhaust ports provided in the preliminary chamber.

3. The substrate treating apparatus according to claim 1, wherein the substrate holding jig mechanism comprises a drive unit and a substrate holding jig placement unit connecting to the drive unit; the preliminary chamber is partitioned by a partition plate into an area where the drive unit is installed, and an area where the substrate holding jig is installed in the substrate holding jig placement unit; the first exhaust port is provided to connect to the area where the drive unit is installed; and the inert gas supply port is provided to connect to the area where the substrate holding jig is installed.

4. The substrate treating apparatus according to claim 1, wherein the specified pressure is a pressure in the vicinity of atmospheric pressure.

5. A substrate treating apparatus comprising:

a processing chamber for storing and processing a substrate;

a preliminary chamber continuously arranged to the processing chamber;

a substrate holding jig mechanism for carrying in and/or carrying out a substrate holding jig for holding multiple substrates to and from the processing chamber;

an inert gas supply port for supplying inert gas to the preliminary chamber;

a first exhaust port provided in the preliminary chamber at a position higher than the inert gas supply port for exhausting the inert gas;

a second exhaust port separate from the first exhaust port and provided in the preliminary chamber at a position lower than the first exhaust port; and a controller for regulating the pressure within the preliminary chamber during exhaust from the second exhaust port, to a pressure lower than the pressure within the preliminary chamber during exhaust from the first exhaust port.

6. The substrate treating apparatus according to claim 5, wherein the first exhaust port is provided in the preliminary chamber at a position higher than the substrate holding area; and the second exhaust port is provided in the preliminary chamber at a position lower than the substrate holding area.

7. The substrate treating apparatus according to claim 5, wherein the substrate holding jig mechanism comprises a drive unit and a substrate holding jig placement unit connecting to the drive unit; the preliminary chamber is partitioned by a partition plate into an area where the drive unit is installed, and an area where the substrate holding jig is installed in the substrate holding jig placement unit; the first exhaust port is provided to connect to the area where the drive unit is installed; and the inert gas supply port is provided to connect to the area where the substrate holding jig is installed.

8. The substrate treating apparatus according to any one of claims 1, 5, 2, 6, 3, or 7, wherein a porous material member is provided in the inert gas supply port, and the inert gas is supplied from the inert gas to the preliminary chamber.

9. The substrate treating apparatus according to any one of claim 3 or 7, wherein a gap is provided between the side wall of the preliminary chamber and the partition plate.

10. The semiconductor device manufacturing method using the substrate treating apparatus according to any one of claims 5, 2, 6, 3, or 7 comprising a step for carrying a substrate holding jig holding the substrates into the processing chamber from the preliminary chamber and/or carrying out from the processing chamber into the preliminary chamber while exhausting from only the first exhaust port, the inert gas supplied from the inert gas supply port in the preliminary chamber and flowing upwards from below the substrate holding area to higher than the substrate holding area; and a step for processing the substrates in the processing chamber.

11. A semiconductor device manufacturing method using a substrate treating apparatus comprising a processing chamber for storing and processing a substrate; a preliminary chamber continuously arranged to the processing chamber; a substrate holding jig mechanism for carrying in and/or carrying out a substrate holding jig for holding multiple substrates to and from the processing chamber; an inert gas supply port for supplying inert gas to the preliminary chamber; a first exhaust port provided in the preliminary chamber at a position higher than the inert gas supply port for exhausting the inert gas; a second exhaust port for drawing a vacuum in the preliminary chamber; and a controller for performing control so that the inert gas supplied from the inert gas supply port is exhausted only from the first exhaust port, while maintaining the preliminary chamber drawn a vacuum from the second exhaust port at a specified pressure after rising of the pressure; and the method comprising:

a step for carrying the substrate holding jig holding multiple substrates into the processing chamber from the preliminary chamber and/or carrying out from the processing chamber into the preliminary chamber while exhausting from only the first exhaust port, the inert gas flowing upwards, supplied from the inert gas supply port in the preliminary chamber; and a step for processing the substrates in the processing chamber.

* * * * *